United States Patent
Nagano

(10) Patent No.: US 12,526,908 B2
(45) Date of Patent: Jan. 13, 2026

(54) CIRCULATION MECHANISM AND OPERATION APPARATUS

(71) Applicant: Ushio Denki Kabushiki Kaisha, Tokyo (JP)

(72) Inventor: Akihisa Nagano, Tokyo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 903 days.

(21) Appl. No.: 17/825,943

(22) Filed: May 26, 2022

(65) Prior Publication Data

US 2023/0021544 A1 Jan. 26, 2023

(30) Foreign Application Priority Data

Jul. 19, 2021 (JP) ................... 2021-118821

(51) Int. Cl.
*H05G 2/00* (2006.01)
*G03F 7/00* (2006.01)

(52) U.S. Cl.
CPC ......... *H05G 2/0027* (2024.08); *H05G 2/0035* (2024.08); *G03F 7/70025* (2013.01); *G03F 7/70033* (2013.01); *G03F 7/70041* (2013.01)

(58) Field of Classification Search
None
See application file for complete search history.

(56) References Cited

U.S. PATENT DOCUMENTS

2014/0307857 A1* 10/2014 Niimi .................... H05G 2/009
378/119

FOREIGN PATENT DOCUMENTS

| JP | 2011-527503 A | 10/2011 |
| JP | 2014-225437 A | 12/2014 |
| JP | 2017-219698 A | 12/2017 |

* cited by examiner

*Primary Examiner* — Andrew Smyth
(74) *Attorney, Agent, or Firm* — Yoshida & Associates LLC; Kenichiro Yoshida

(57) ABSTRACT

A circulation mechanism includes a storage section, a supply pipe, a collection pipe, a circulation drive section, and a protective member. The storage section accommodates liquid metal. The supply pipe supplies the liquid metal accommodated in the storage section to a target mechanism. The collection pipe is communicated with the storage section and collects the liquid metal that has been drained away from the target mechanism into the storage section. The circulation drive section allows the liquid metal accommodated in the storage section to move to the supply pipe, and thus circulates the liquid metal to and from the target mechanism. The protective member is disposed to cover a portion of an inner wall of the collection pipe, the portion corresponding to a position at which the liquid metal flowing through the collection pipe collides with the liquid metal accommodated in the storage section.

13 Claims, 7 Drawing Sheets

CIRCULATION MECHANISM AND OPERATION APPARATUS

CROSS-REFERENCE TO RELATED APPLICATION(S)

This application claims priority from Japanese Patent Application No. 2021-118821. The entire teachings of the above application are incorporated herein by reference.

BACKGROUND

The present invention relates to a circulation mechanism that allows liquid metal to circulate and an operation apparatus that is operated using the liquid metal.

In recent years, a light source for exposure has been being developed to emit light having a shorter wavelength as semiconductor integrated circuits are miniaturized and highly integrated. As a next-generation light source for semiconductor exposure systems, an extreme ultraviolet (hereinafter, occasionally referred to as "EUV") light source apparatus that emits extreme ultraviolet light having a wavelength of, particularly, 13.5 nm is being developed.

Several methods are known to emit EUV light (EUV emission) from the EUV light source apparatus. One of such methods involves a method of generating high-temperature plasma by heating and exciting an extreme ultraviolet light emission seed (EUV emission seed), and extracting EUV light from the high-temperature plasma. EUV light source apparatuses that employ such a method are categorized into a laser produced plasma (LPP) method and a discharge produced plasma (DPP) method, depending upon a method used to generate high-temperature plasma.

A DPP-based EUV light source apparatus applies a high voltage across a pair of electrodes, between which a discharge gas containing an extreme ultraviolet light emission seed (vaporized plasma raw material) has been supplied, to generate high-density high-temperature plasma upon electric discharging, and then uses extreme ultraviolet light emitted therefrom. In the DPP-based EUV light source apparatus as disclosed in, for example, Japanese Patent Application Laid-Open Publication No. 2017-219698, a method has been proposed that involves supplying a surface of the electrodes (discharge electrodes), between which discharge is generated, with a liquid high-temperature plasma raw material, for example, Sn (tin) or Li (lithium), including the extreme ultraviolet light emission seed, irradiating the raw material with an energy beam such as a laser beam for evaporation thereof, and then generating high-temperature plasma upon the electric discharging. This method is sometimes referred to as a laser assisted discharge produced plasma (LDP) method.

In contrast, an LPP-based EUV light source apparatus irradiates a target material with a laser beam to excite the target material, then generating plasma.

EUV light source apparatuses are used as light source apparatuses for semiconductor exposure systems (lithography systems) for manufacturing semiconductor devices. Alternatively, EUV light source apparatuses are used as light source apparatuses for mask inspection systems used in lithography. In other words, the EUV light source apparatuses are used as light source apparatuses for other optical systems (utilization apparatus) that use EUV light.

In the LDP method described above, high-temperature plasma raw material is supplied to the surface of the discharge electrodes. Specifically, Japanese Patent Application Laid-Open Publication No. 2017-219698 discloses that liquid-phase plasma raw material (e.g., liquid-phase tin) is stored in a container, and the disk-shaped discharge electrodes (anode and cathode) are partially immersed in the liquid-phase plasma raw material. The discharge electrodes are configured to be rotatable. When the discharge electrode rotates, the portion of the discharge electrode immersed in the liquid-phase plasma raw material is transported to the discharge region. In other words, the liquid-phase plasma raw material is transported to the discharge region. The term "discharge region" is referred to as an area where the discharge will occur after irradiated with the energy beam described above. The container in which the plasma raw material is stored and the discharge electrodes (anode and cathode) function as the plasma source, generating high-temperature plasma in the discharge region.

The liquid-phase plasma raw material stored in the container is consumed by the plasma generation and decreases in volume. Hence, to replenish the plasma raw material, the container storing the liquid-phase plasma raw material is connected to a plasma raw material supply mechanism that includes a reservoir holding the liquid-phase plasma raw material. Japanese Patent Application Laid-Open Publication No. 2014-225437 discloses this plasma raw material supply mechanism.

The discharge electrodes are heated as the discharge occurs. Here, as mentioned above, the discharge electrodes are partially immersed in the liquid-phase plasma raw material stored in the container. Hence, rotating the discharge electrode allows at least the portion of the discharge electrode heated by the discharge to pass through the above liquid-phase plasma raw material, and heat exchange occurs between the heated portion and the liquid-phase plasma raw material, whereby the portion heated by the discharge is cooled. In contrast, the temperature of the liquid-phase plasma raw material stored in the container rises. Therefore, circulating the liquid-phase plasma raw material between the container and the plasma raw material supply mechanism including the above reservoir and cooling at least portion of the circulation path makes it possible to supply the liquid-phase plasma raw material to the container and also to maintain the temperature of the liquid-phase plasma raw material stored in the container at a predetermined temperature.

From the viewpoints of ease of machinability and material cost, stainless steel is typically used as a material for the components of the plasma raw material supply mechanism. However, stainless steel does not have sufficient resistance to electrochemical corrosion of molten metal (e.g., lithium and tin), which is liquid-phase plasma raw material, and mechanical erosion of heated metal. In order to provide stainless steel with resistance to molten metal (liquid metal), Japanese Patent Application Laid-Open Publication No. 2011-527503 discloses a technique that coats the surface of the plasma raw material supply mechanism that is made of stainless steel and in contact with liquid metal with a covalent inorganic solid material. Examples of the covalent inorganic solid material includes TiN.

SUMMARY OF THE INVENTION

In liquid metal supply mechanisms such as the above-mentioned plasma raw material supply mechanism, it is important to prevent piping and other components inside the mechanisms from being eroded by liquid metal.

In view of the above circumstances, it is an object of the present invention to provide a circulation mechanism and an operation apparatus capable of preventing erosion by liquid metal.

In order to achieve the above-mentioned object, a circulation mechanism according to one embodiment of the present invention includes a storage section, a supply pipe, a collection pipe, a circulation drive section, and a protective member. The storage section accommodates liquid metal. The supply pipe supplies the liquid metal accommodated in the storage section to a target mechanism. The collection pipe is communicated with the storage section and collects the liquid metal that has been drained away from the target mechanism into the storage section. The circulation drive section allows the liquid metal accommodated in the storage section to move to the supply pipe, and thus circulates the liquid metal to and from the target mechanism. The protective member is disposed to cover a portion of an inner wall of the collection pipe, the portion corresponding to a position at which the liquid metal flowing through the collection pipe collides with the liquid metal accommodated in the storage section.

In the circulation mechanism, the protective member is disposed on the inner wall of the collection pipe. The protective member is disposed to cover the portion corresponding to the position at which the liquid metal flowing through the collection pipe collides with the liquid metal accommodated in the storage section. This configuration makes it possible to prevent the collection pipe from being eroded by the liquid metal.

The collection pipe may be communicated with the storage section at a location at which the liquid metal accommodated in the storage section enters the interior of the collection pipe. In this case, the protective member may be disposed to cover a portion of the inner wall of the collection pipe that is in contact with a liquid surface of the liquid metal entering the inside of the collection pipe.

The collection pipe may include a protective coating configured on the inner wall of the collection pipe. In this case, the protective member may be disposed on the protective coating.

The protective member may have a hollow cylindrical shape and be inserted into the interior of the collection pipe.

The protective member may include a deformable sheet member and is inserted into the interior of the collection pipe in a deformed state along the inner wall of the collection pipe.

The protective member may include a hollow tubular member and be inserted into the interior of the collection pipe.

The liquid metal may include tin, lithium, gadolinium, terbium, gallium, or an alloy containing at least one of these materials.

The protective member may include molybdenum, titanium, vanadium, chromium, zirconium, niobium, hafnium, tantalum, tungsten, rhenium, ruthenium, osmium, iridium, or an alloy containing at least one of these materials.

The protective coating may include titanium nitride, titanium, or an alloy containing at least one of these materials.

The storage section may include a connection hole to which the collection pipe is connected. In this case, the collection pipe may be connected to the connection hole in a manner in which the collection pipe protrudes from the connection hole toward the interior of the storage section.

The collection pipe may include a pipe outlet through which the liquid metal drains away to the storage section. In this case, the protective member may include a protrusion that protrudes from the pipe outlet toward the interior of the storage section. The protrusion may include an outlet through which the liquid metal that has been drained away from the pipe outlet drains away to the liquid metal accommodated in the storage section.

The protrusion may extend along a direction inclined to a liquid surface of the liquid metal accommodated in the storage section, and the outlet of the protrusion may include an end face that is configured to be parallel to the liquid surface.

The collection pipe may include a pipe inlet through which the liquid metal that has been drained away from the target mechanism flows in, and a pipe outlet through which the liquid metal drains away to the storage section. The pipe outlet may be located lower than the pipe inlet in a vertical direction. The collection pipe may be disposed inclined to the storage section.

The circulation mechanism may further include a temperature adjustment mechanism that adjusts a temperature for at least one of the liquid metal flowing through the collection pipe, the liquid metal accommodated in the storage section, or the liquid metal flowing through the supply pipe.

An operation apparatus according to one embodiment of the present invention includes an operation section that is operated using liquid metal and the circulation mechanism described above.

The operation section may include a container that accommodates the liquid metal as plasma raw material and a rotating electrode that is partially immersed in the plasma raw material, allows an electrical discharge to be generated at a portion of the rotating electrode to which the plasma raw material is attached, and thus generate plasma that emits radiation. In this case, the operation apparatus may be configured as an apparatus that emits the radiation.

As described above, the present invention enables the prevention of erosion caused by liquid metal. The effects described herein are not necessarily limited to the effects of the present invention; however, any of the effects described in this disclosure may be included in the effects of the present invention.

DETAILED DESCRIPTION OF THE EMBODIMENTS

Hereinafter, with reference to the accompanying drawings, embodiments according to the present invention will be described.

[Plasma Raw Material Supply Mechanism]

Figure 1:
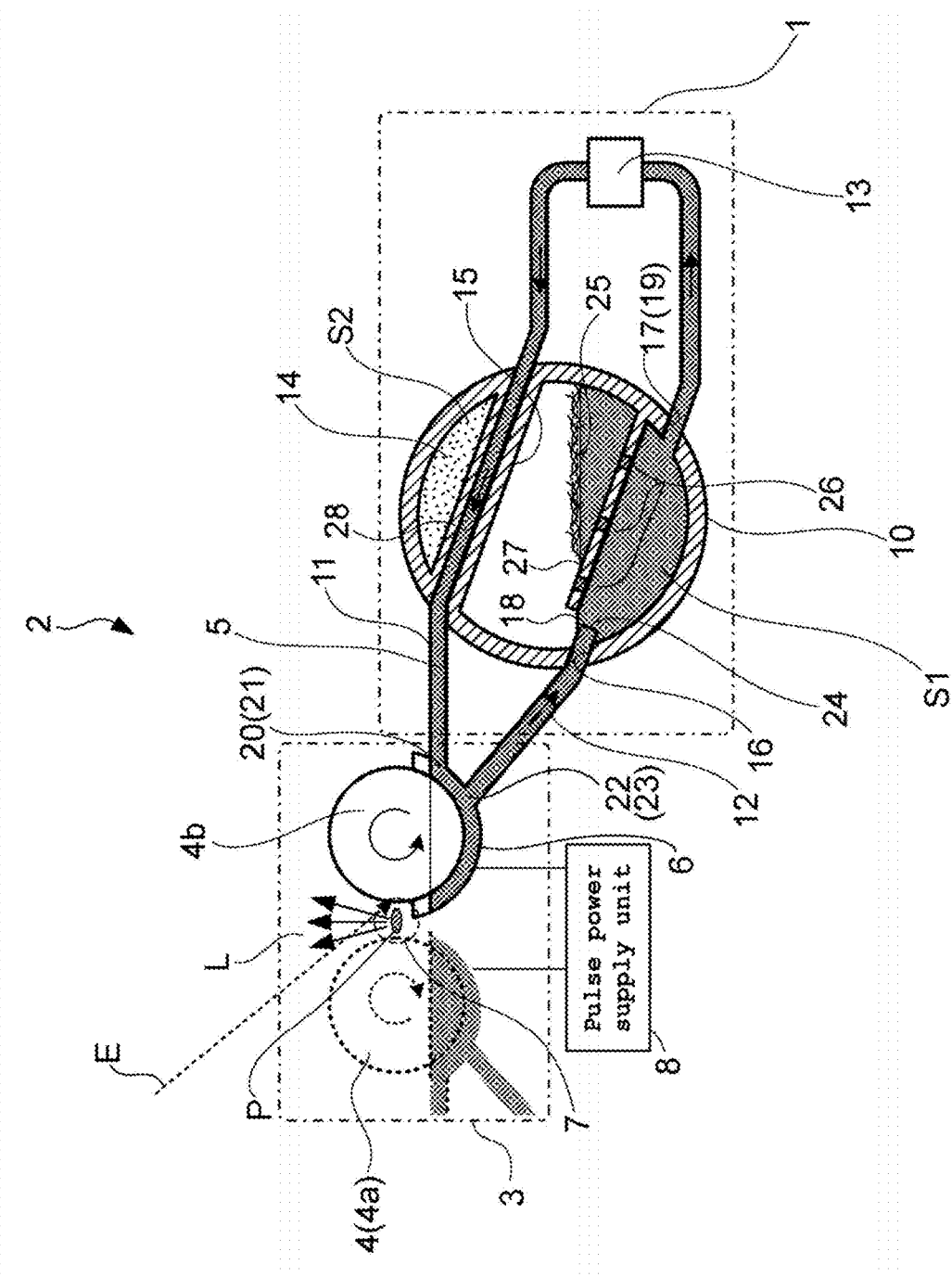
FIG. 1 is a schematic view illustrating a basic configuration example of a plasma raw material supply mechanism according to an embodiment of the present invention.

FIG. 1 is a schematic view illustrating a basic configuration example of a plasma raw material supply mechanism according to an embodiment of the present invention. Here, the embodiment is described such that the plasma raw material supply mechanism 1 is configured in the LDP-based EUV light source apparatus 2. The plasma raw material supply mechanism 1 corresponds to an embodiment of a circulation mechanism in accordance with the present invention. The LDP-based EUV light source apparatus 2 including the plasma raw material supply mechanism 1 corresponds to an embodiment of an operation apparatus in accordance with the present invention.

First, briefly described is a plasma source 3 of the EUV light source apparatus 2 to which the plasma raw material supply mechanism 1 is connected. The plasma source 3 includes disk-shaped discharge electrodes 4 (anode 4a, cathode 4b) and a container 6 that accommodates liquid-phase plasma raw material 5. The disk-shaped discharge electrodes 4 are partially immersed in the liquid-phase plasma raw material 5 stored in the container 6. In the present embodiment, liquid-phase tin is used as the plasma raw material 5. The plasma raw material 5 corresponds to an embodiment of the liquid metal in accordance with the present invention. The plasma source 3 may also be referred to as a source module (heat source) or a source head.

The discharge electrodes 4 (anode 4a and cathode 4b) are configured to be rotatable. When the discharge electrode 4 rotates, the portion of the discharge electrode 4 immersed in the liquid-phase plasma raw material 5 is transported to the discharge region 7. In other words, the portion of the discharge electrode 4 onto which the liquid-phase plasma raw material 5 is applied is transported to the discharge region 7. Here, the discharge region 7 is a region in which a discharge is generated after irradiated with the energy beam E, such as a laser beam. In this way, the plasma raw material 5 in a fresh state is constantly supplied to the discharge region 7. The liquid-phase plasma raw material 5 also serves as a refrigerant for the discharge electrodes 4.

A pulse power supply unit 8 for generating a discharge between the anode 4a and the cathode 4b is connected to the container 6 made of metal. The pulse power supply unit 8 feeds power to each of the discharge electrodes 4 via the container 6, which is electrically connected to each of the discharge electrodes 4, and the liquid-phase plasma raw material 5, which is conductive. When the cathode 4b is irradiated with the energy beam E, a discharge occurs between the two electrodes onto which the plasma raw material 5 is applied, generating high-temperature plasma P to emit EUV light L.

As shown in FIG. 1, the plasma raw material supply mechanism 1 is configured to be capable of supplying and collecting the liquid-phase plasma raw material 5 to and from the container 6 that is located on the side of the cathode 4b of the plasma source 3. A similar plasma raw material supply mechanism 1 is also connected to the side of the anode 4a of the plasma source 3. Hereinafter, the plasma raw material supply mechanism 1 that supplies the raw material to the side of the cathode 4b is described to represent the two plasma raw material supply mechanisms 1.

The plasma raw material supply mechanism 1 includes a reservoir (chamber) 10, a supply pipe 11, a collection pipe 12, a pump 13, and a cooling mechanism 14. The reservoir 10 has a hollow cylindrical shape as an approximate outline. The reservoir 10 has a relatively small dimension in a height direction of the cylindrical shape. The reservoir 10 is disposed to allow an axial direction of the central axis of its cylindrical shape to be about parallel to the horizontal direction. In other words, the reservoir 10 is a cylindrical hollow member with a low height and is disposed horizontally. FIG. 1 is a schematic cross-sectional view illustrating the reservoir 10 cut in a direction perpendicular to the axial direction of the central axis thereof. The configuration of the reservoir 10 is not limited to that described in FIG. 1 and may be any other configurations employed.

As shown in FIG. 1, the reservoir 10 has an interior space divided into two major spaces. Specifically, when the reservoir 10 is viewed along the central axis of its cylindrical shape, the reservoir 10 has a wall 15 configured to extend downward diagonally from a position on the upper side thereof. The space on the lower side partitioned by the wall 15 is a raw material supply space S1 in which the plasma raw material 5 is accommodated. The space on the upper side partitioned by the wall 15 is a raw material passage space S2 that includes a pathway through which the plasma raw material 5 drains away to the container 6. The raw material supply space S1 and the raw material passage space S2 are sealed each other and spatially divided by the wall 15.

The raw material supply space S1 of the reservoir 10 is designed to have a larger volume than the container 6 of the plasma source 3. This configuration makes it possible to fill the container 6 with the plasma raw material 5 to be consumed, for example, in the discharge operation for a relatively long period of time.

As shown in FIG. 1, the outer wall of the reservoir 10, which constitutes the raw material supply space S1, is formed with a collection side connection hole 16 to which the collection pipe 12 is connected and a supply side connection hole 17 to which the supply pipe 11 is connected. The collection side connection hole 16 is configured to be communicated with the raw material supply space S1 in the vicinity the position of a liquid surface 18 of the plasma raw material 5 accommodated in the raw material supply space S1. The supply side connection hole 17 is configured to be communicated with the raw material supply space S1 in the vicinity of the lowest position of the raw material supply space S1. Hence, the supply side connection hole 17 is configured to be located deeply in the plasma raw material 5 accommodated in the raw material supply space S1.

The supply pipe 11 is used to supply the plasma raw material 5 accommodated in the raw material supply space S1 to the container 6. The supply pipe 11 has one end connected to the supply side connection hole 17 that is communicated with the raw material supply space S1. Hence, this end acts as a pipe inlet 19 through which the plasma raw material 5 flows in. (In FIG. 1, the reference sign 19 is marked at the same location at which the supply side connection hole 17 is assigned.) The supply pipe 11 has another end connected to a raw material return port 20 formed in the container 6. The raw material return port 20 is a hole through which the plasma raw material 5 is supplied to the container 6. Hence, this end acts as a pipe outlet 21 through which the plasma raw material 5 drains away. (In FIG. 1, the reference sign 21 is marked at the same location at which the raw material return port 20 is assigned.) Accordingly, the supply pipe 11 communicates with both of the raw material supply space S1 of the reservoir 10 and the container 6, and supplies the plasma raw material 5 accommodated in the raw material supply space S1 to the container 6.

The collection pipe 12 is used to collect the plasma raw material 5 from the container 6. The collection pipe 12 has one end connected to a raw material exhaust port 22 formed in the container 6. The raw material exhaust port 22 is a hole through which the plasma raw material 5 is exhausted from inside the container 6. Hence, this end acts as a pipe inlet 23 through which the plasma raw material 5 flows in. (In FIG. 1, the reference sign 23 is marked at the same location at which the raw material exhaust port 22 is assigned.) The collection pipe 12 has another end connected to the collection side connection hole 16 that is communicated with the raw material supply space S1. In the present embodiment as shown in FIG. 1, the collection pipe 12 is connected to the collection side connection hole 16 in a manner in which the collection pipe 12 protrudes from the collection side connection hole 16 toward the interior of the reservoir 10. The plasma raw material 5 drains away from a pipe outlet 24 located inside the reservoir 10 into the reservoir 10. Accordingly, the collection pipe 12 communicates with each of the container 6 and the raw material supply space S1 of the reservoir 10, and collects the plasma raw material 5 that has been drained away from the container 6 into the raw material supply space S1.

The reservoir 10, the supply pipe 11, and the collection pipe 12 are made of stainless steel. A coating resistant to liquid metal (not shown in the figure) is configured to be applied as a protective coating on the areas including the inner walls of the reservoir 10, the supply pipe 11, and the collection pipe 12, where the plasma raw material 5 is in contact. Examples of the protective coating include a coating made of a covalent inorganic solid material. In the present embodiment, a TiN coating composed of titanium nitride (TiN) is formed; however, a protective coating composed of other materials can be formed. For example, the protective coating may be made of titanium nitride (TiN), titanium (Ti), or an alloy containing at least one of these materials.

The supply pipe 11 is provided with a pump 13. When the pump 13 is driven, the plasma raw material 5 accommodated in the raw material supply space S1 of the reservoir 10 drains away to the supply pipe 11, enabling the plasma raw material 5 to circulate in a circulation system of the reservoir 10, the supply pipe 11, the container 6, and the collection pipe 12. In other words, driving the pump 13 enables the plasma raw material 5 in the reservoir 10 to be supplied to the container 6 and collected in the reservoir 10. Examples of the pump 13 include an electromagnetic pump. In the electromagnetic pump, when a magnetic field is applied from outside the supply pipe 11 and an electric current flows through the plasma raw material 5 in the supply pipe 11, then the Lorentz force is generated, forming a flow of the plasma raw material 5 within the supply pipe 11. This flow generates a pump force that is capable of moving the plasma raw material 5 accommodated in the raw material supply space S1 into the supply pipe 11.

The location of the pump 13 is not limited to that described in FIG. 1. The pump 13 can be disposed at any location in the circulation path including the reservoir 10, the supply pipe 11, and the collection pipe 12 as long as it generates a pump force that is capable of flowing the plasma raw material 5 accommodated in the raw material supply space S1 into the supply pipe 11. It is noted that the plasma raw material 5 supplied to the container 6 drains away from the raw material exhaust port 22 to the collection pipe 12 due to the rotation of the discharge electrode 4.

The raw material return port 20 is formed in the vicinity of the area in the container 6 where the discharge electrode 4 passes just before reaching the discharge region 7. The raw material exhaust port 22 is formed in the vicinity of the area in the container 6 where the portion of the discharge electrode 4 that has been irradiated with the energy beam E is immersed again in the plasma raw material 5 in the container 6. This configuration enables the plasma raw material 5 having a predetermined preset temperature to be transported to the discharge region 7 on the discharge electrode 4 before the discharge electrode 4 is irradiated with the energy beam E and before the discharge occurs. When the discharge electrode 4 that have been heated by the discharge generation comes into contact with the plasma raw material 5 in the container 6, and thus the plasma raw material 5 is heated to a desired temperature or higher; however, this configuration enables this heated plasma raw material 5 to be quickly exhausted from the container 6. Therefore this makes it possible to prevent the effect of the heated plasma raw material 5 from influencing the plasma raw material 5 that is to be transported to the discharge region 7 for the next discharge.

The hot plasma raw material 5 collected from the collection pipe 12 is exhausted from the pipe outlet 24 of the collection pipe 12 into the raw material supply space S1 of the reservoir 10 to be mixed with the plasma raw material 5 in the reservoir 10, and thus is cooled to some extent.

Here, the plasma raw material 5 exhausted from the container 6 contains impurities and slag 25 such as metal oxide (tin oxide). Then the slag 25, which is contained in the plasma raw material 5 exhausted from the pipe outlet 24 of the collection pipe 12 to the reservoir 10, agglomerates on the liquid surface 18 of the liquid-phase plasma raw material 5 in the reservoir 10.

As shown in FIG. 1, the present embodiment is provided with a plate-shaped slag separator 27 having holes 26 in the raw material supply space S1. The slag separator 27 is provided such that it extends diagonally from a position on the upper side of the supply side connection hole 17, which is provided on the lower side of the reservoir 10, to the vicinity of the collection side connection hole 16 from which the plasma raw material 5 is exhausted. The slag separator 27 is configured as a barrier between the liquid surface 18 on which the slag 25 agglomerates and the supply side connection hole 17 provided on the lower side of the reservoir 10. This configuration allows the liquid-phase plasma raw material 5 exhausted from the collection pipe 12, which is connected to the collection side connection hole 16, to be separated from the slag 25 agglomerating on the liquid surface 18 of the liquid-phase plasma raw material 5. As a result, this makes it possible to prevent the plasma raw material 5 in a state in which the slag 25 has been mixed therewith from draining away to the supply pipe 11, which is connected to the supply side connection hole 17.

The plasma raw material 5 collected from the container 6 to the reservoir 10 through the collection pipe 12 is cooled to some extent by mixing with the plasma raw material 5 in the reservoir 10. In addition, the temperature of the plasma raw material 5 is adjusted to a suitably higher temperature level (1 to 50 K) than a melting temperature of the plasma raw material 5 before the plasma raw material 5 is returned to the container 6.

The cooling mechanism 14 can perform cooling (temperature adjustment) on the plasma raw material 5. As shown in FIG. 1, the cooling mechanism 14 is provided in the raw material passage space S2. In the raw material passage space S2, a through channel 28 is formed across the raw material passage space S2. The supply pipe 11 is provided in the through channel 28. Alternatively, the through channel 28 itself may be configured as a part of the supply pipe 11.

The cooling mechanism 14 is configured for the through channel 28 and performs cooling (temperature adjustment)

of the plasma raw material 5 by cooling the through channel 28. Examples of the cooling mechanism 14 include a spray cooling mechanism, a heat pipe, and a radiator, which are disclosed in Japanese Patent Application Laid-Open Publication No. 2014-225437. (In FIG. 1, the cooling mechanism is schematically shown as a dot pattern in the raw material passage space S2.)

In the plasma source 3, the plasma raw material 5 in the container 6 is consumed by the discharge operation (high-temperature plasma generation). The plasma raw material 5 stored in the raw material supply space S1 of the reservoir 10 is replenished into the container 6 by the amount of the plasma raw material consumed. As a result, the amount of the plasma raw material 5 stored in the reservoir 10 is also gradually reduced. In the present embodiment, the raw material supply space S1 is provided with a sensor (not shown) that senses the amount of plasma raw material 5 stored in the space. The sensor is, for example, a level sensor that detects the liquid surface level of the plasma raw material 5, which is disclosed in Japanese Patent Application Laid-Open Publication No. 2014-225437. When the level sensor fails to detect the contact with the plasma raw material 5, the plasma raw material 5 is replenished to the raw material supply space S1 of the reservoir 10 again. The plasma raw material 5 is replenished through a plasma raw material replenishment port, which is omitted from the figure. The plasma raw material replenishment port is located in the raw material supply space S1 of the reservoir 10 where the plasma raw material 5 is stored.

When the discharge electrode 4 of the plasma source 3 is cooled and the high-pressure plasma P produced by the plasma source 3 is used to generate EUV emission, the plasma raw material 5 may include lithium (Li), tin (Sb), gadolinium (Gd), terbium (Tb), gallium (Ga), or an alloy containing at least one of these materials. The present invention can be applied to any liquid metals, which are not limited to these materials described above.

The plasma source 3 and the plasma raw material supply mechanism 1 are disposed in the EUV light source apparatus 2. The plasma raw material 5, which is stored in the plasma raw material supply mechanism 1 or circulates to and from the container 6 of the plasma source 3, is liquid metal maintained with high heat. Hence, it is desirable to shield undesirable thermal radiation from the plasma raw material 5 to other mechanisms disposed in the EUV light source apparatus 2 and around the plasma raw material supply mechanism 1. For this reason, the reservoir 10 accommodating the plasma raw material 5 is disposed in a state of negative pressure to suppress thermal radiation to other surrounding mechanisms.

In the present embodiment, the mechanism that generates EUV light L in the plasma source 3 corresponds to one embodiment of the target mechanism. The mechanism that generates the EUV light L corresponds to one embodiment of the operation section that operates using liquid metal. The reservoir 10 (the portion constituting the raw material supply space S1) corresponds to one embodiment of the storage section that accommodates the liquid metal. The supply pipe 11 corresponds to one embodiment of the supply pipe according to the present invention. The collection pipe 12 corresponds to one embodiment of the collection pipe according to the present invention. The pump 13 corresponds to one embodiment of the circulation drive section that circulates the liquid metal to and from the target mechanism by moving the liquid metal contained in the storage section to the supply pipe. The collection side connection hole 16 of the reservoir 10 corresponds to one embodiment of the connection hole to which the collection pipe is connected. The pipe outlet 24 of the collection pipe 12 corresponds to one embodiment of the pipe outlet through which liquid metal drains away to the storage section. The cooling mechanism 14 corresponds to one embodiment of the temperature adjustment mechanism that adjusts a temperature for at least one of the liquid metal flowing through the collection pipe, the liquid metal accommodated in the storage section, or the liquid metal flowing through the supply pipe.

[Erosion of Pipes and Other Components]

Japanese Patent Application Laid-Open Publication No. 2014-225437 discloses that the plasma raw material 5 may cause erosion in areas with which the plasma raw material 5 (liquid metal such as liquid-phase tin) heated to high temperatures is in contact, including the inner wall of the collection pipe 12, the inner wall of the supply pipe 11, the inner wall of the reservoir 10, and the like, even though a protective coating such as TiN coating is formed thereon. According to Japanese Patent Application Laid-Open Publication No. 2014-225437, such erosion occurs when high stress by the heat or flow of the plasma raw material 5 is applied to areas, such as an area at which the pipe constituting the circulation path of the plasma raw material 5 is twisted in a flowing direction of the liquid metal and an area with which the plasma raw material 5 mechanically collides in the reservoir 10.

The inventor of the present invention has studied the erosion of pipes and other components caused by the plasma raw material 5. The inventor investigated portions of the pipe and the like eroded by the plasma raw material 5 (the portions in which the TiN coating was destroyed and the pipe and other components were damaged) and confirmed that the erosion occurred only at certain locations. If the erosion is caused by the stress due to the flowing force of the plasma raw material 5, erosion will occur randomly in all areas to which the stress is applied; however, erosion was confirmed to occur only in certain locations by the achievement on actual apparatuses and the result of experiments. This suggests that the occurrence of erosion in the TiN coating and pipes is not necessarily caused by the stress (shear stress) associated with the flow of the plasma raw material 5. In addition, when the inventor conducted an experiment using a test specimen having the same material as the pipe on which TiN was deposited, no damage to the TiN coating and no erosion of its base material were observed even due to the stress associated with the heat from the plasma raw material 5.

FIGS. 2A, 2B, 3A, and 3B are enlarged views illustrating the portion of the collection side connection hole 16 of the reservoir 10. The inventor's investigation confirms that erosion occurs at a connecting portion between the collection pipe 12 and the reservoir 10. The inventor investigated detail locations in which erosion occurs at the connecting portion, which is between the collection pipe 12 and the reservoir 10, for several configurations illustrated in FIGS. 2A to 3B.

As also shown in FIG. 1, in this embodiment, the pipe outlet 24 of the collection pipe 12 is disposed on the lower side in the vertical direction compared with the pipe inlet 23 through which the plasma raw material 5 that has been drained away from the container 6 flows in. The collection pipe 12 is disposed to be inclined with respect to the reservoir 10. This inclined arrangement includes various configurations in which the line connecting the pipe inlet 23 and the pipe outlet 24 of the collection pipe 12 is inclined with respect to the reservoir 10. Examples of the inclined arrangement include a configuration in which the collection pipe 12 that is configured in a straight line without being bent is inclined with respect to the reservoir 10. However, the examples of the inclined arrangement, in which the collection pipe 12 is disposed to be inclined with respect to the reservoir 10, is not limited to the configuration described above; the examples of the inclined arrangement include a configuration in which the collection pipe 12 having a portion that is bent in the middle thereof is disposed diagonally with respect to the reservoir 10 provided that the line connecting the pipe inlet 23 and the pipe outlet 24 of the collection pipe 12 is inclined with respect to the reservoir 10. The several configurations illustrated in FIGS. 2A to 3B are all included in a configuration in which the collection pipe 12 is disposed to be inclined with respect to the reservoir 10.

Figure 2A:
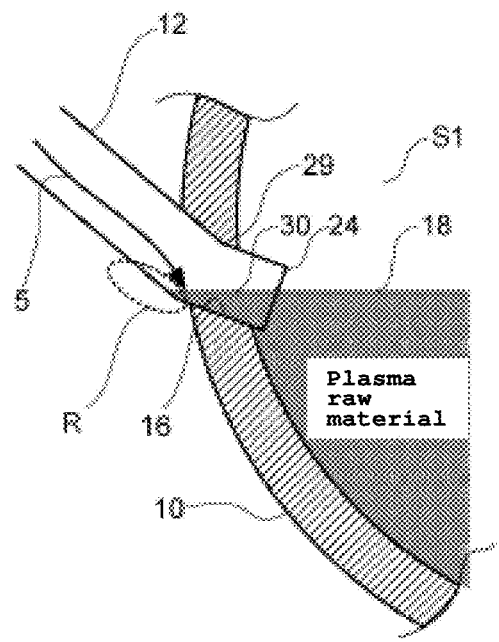
FIGS. 2A and 2B are enlarged views each illustrating the portion of a collection side connection hole in a reservoir.

In the configuration shown in FIG. 2A, the collection pipe 12 is bent in the vicinity of the pipe outlet 24 of the collection pipe 12. The portion that is bent (hereinafter referred to as the bent portion) 29 is connected to the collection side connection hole 16 of the reservoir 10. A portion of the lower side of the pipe outlet 24 of the collection pipe 12 is immersed to the lower side than the liquid surface 18 of the plasma raw material 5 accommodated in the reservoir 10 (raw material supply space S1). Hence, the collection pipe 12 is in a state in which the plasma raw material 5 enters the collection pipe 12 from the pipe outlet 24 to the inside of the bent portion 29. Thus, in the embodiment shown in FIG. 2A, the collection pipe 12 is communicated with the reservoir 10 at a location where the plasma raw material 5 accommodated in the reservoir 10 enters the interior of the collection pipe 12.

In the configuration shown in FIG. 2A, erosion occurred in the region R of the inner wall of the collection pipe 12, the region R being in the vicinity of the location of a liquid surface 30 of the plasma raw material 5 entering the inside of the collection pipe 12. The plasma raw material 5 entering the inside of the collection pipe 12 is included in the plasma raw material 5 accommodated in the reservoir 10. The liquid surface 30 of the plasma raw material 5 entering the inside of the collection pipe 12 typically has a position equal to that of the liquid surface 18 of the plasma raw material 5 that has not entered the collection pipe 12. There may be a case in which the liquid surface 30 of the plasma raw material 5 entering the inside of the collection pipe 12 has a position different from that of the liquid surface 18 of the plasma raw material 5 that does not enter the inside of the collection pipe 12 depending on the configuration of the collection pipe 12 or the connection configuration between the collection pipe 12 and the reservoir 10; however, the present invention is still applicable to this case. In the investigation result shown in FIG. 2A, it is also possible to consider that stress caused by the heat and flow of the plasma raw material 5 acted on the bent portion 29, as disclosed in Japanese Patent Application Laid-Open Publication No. 2014-225437.

Figure 2B:
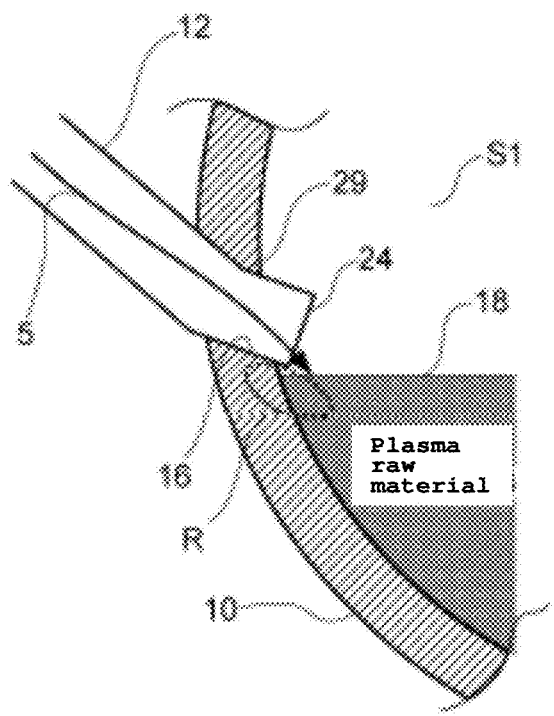

In the configuration shown in FIG. 2B, which is similar to the configuration shown in FIG. 2A, the collection pipe 12 that is bent in the vicinity of the pipe outlet 24 is used. In contrast, the liquid surface 18 of the plasma raw material 5 accommodated in the reservoir 10 has a position that is set lower than that of the pipe outlet 24 of the collection pipe 12. In the configuration shown in FIG. 2B, the pipe outlet 24 of the collection pipe 12 has a position located higher than that of the liquid surface 18 of the plasma raw material 5, thus making no contact with the plasma raw material 5. Hence, the plasma raw material 5 does not enter the inside of the collection pipe 12. The plasma raw material 5 flowing through the collection pipe 12 drains away from the pipe outlet 24 into the raw material supply space S1 and collides with the liquid surface 18 of the plasma raw material 5 accommodated in the reservoir 10.

In the configuration shown in FIG. 2B, erosion was not observed in all areas of the inner wall of the collection pipe 12 including the bent portion 29. In contrast, erosion occurred in the region R of the inner wall of reservoir 10, the region R being in the vicinity of the location at which the plasma raw material 5 draining away from the collection pipe 12 collides with the liquid surface 18 of the plasma raw material 5. Hence, this result leads to the finding that the occurrence of erosion involves other matters rather than the action of stress caused by the heat and flow of the plasma raw material 5.

Figure 3A:
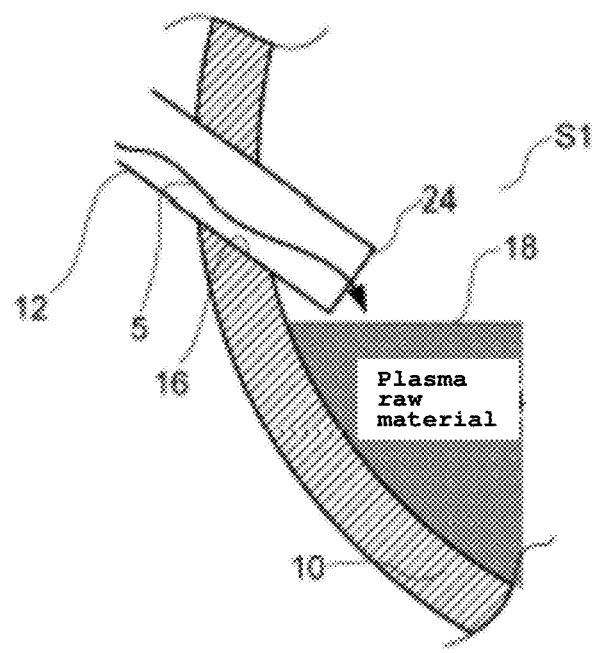
FIGS. 3A and 3B are enlarged views each illustrating the portion of the collection side connection hole in the reservoir.

In the configuration shown in FIG. 3A, the collection pipe 12 having a straight shape with no bent portion is used. The collection pipe 12 is connected to the collection side connection hole 16 such that the pipe outlet 24 protrudes toward the interior of the reservoir 10 relative to the collection side connection hole 16. In addition, the liquid surface 18 of the plasma raw material 5 has a position that is set lower than that of the pipe outlet 24 of the collection pipe 12, making no contact with the pipe outlet 24. Hence, the plasma raw material 5 does not enter the inside of the collection pipe 12. The plasma raw material 5 flowing through the collection pipe 12 drains away from the pipe outlet 24 into the raw material supply space S1 and collides with the liquid surface 18 of the plasma raw material 5 accommodated in the reservoir 10.

In the configuration shown in FIG. 3A, the plasma raw material 5 draining away from the collection pipe 12 collides with the liquid surface 18 at the location close to the center (inside) of the reservoir 10, compared with the location in the configuration shown in FIG. 2A. In other words, in the configuration shown in FIG. 3A, the plasma raw material 5 draining away from the collection pipe 12 collides with the liquid surface 18 at the position farther away from the inner wall of the reservoir 10 (the inner wall in the vicinity of the collection side connection hole 16) than that in the configuration shown in FIG. 2A. In the configuration shown in FIG. 3A, no erosion was observed on the inner wall of the collection pipe 12 and on the inner wall of the reservoir 10.

Figure 3B:
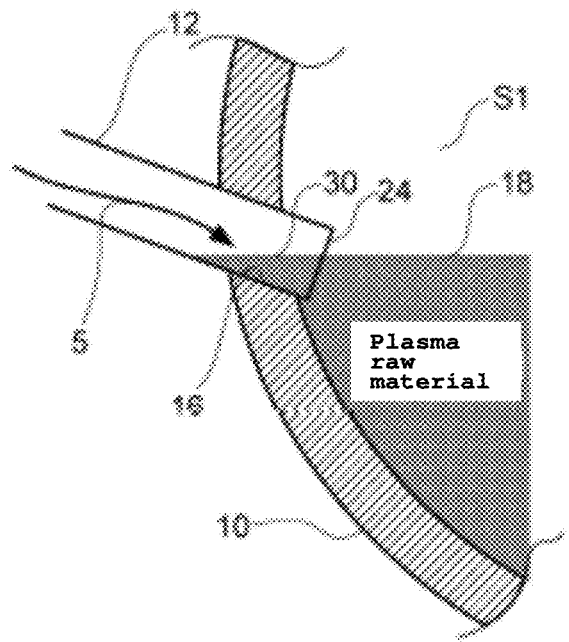

In the configuration shown in FIG. 3B, the collection pipe 12 having a straight shape with no bent portion is used, as similar to the configuration shown in FIG. 3A. In contrast, the collection pipe 12 is communicated with the reservoir 10 at the location where the plasma raw material 5 accommodated in the reservoir 10 enters the interior of the collection pipe 12. This configuration has become the subject of study when conducting the pressure fluctuation simulation described later.

Based on the investigation results on the location at which erosion occurred in the configurations in FIGS. 2A, 2B, and 3A, the inventor further examined the study. In addition, the inventor obtained the finding that cavitation erosion occurs on TiN material after having examined, for example, the literatures on cavitation erosion tests for various materials. In other words, the finding that TiN material is a material having low impact resistance is obtained.

The investigation results shown in FIGS. 2A and 2B indicate that the erosion occurs in the region that is in the vicinity of the location at which the flow of the plasma raw material 5 flowing inside the collection pipe 12, which is collected from the container 6, collides with the liquid surface 18 (30) of the plasma raw material 5 stored in the reservoir 10 (raw material supply space S1). Hence, it is considered that the position of erosion follows the position of the liquid surface 18 (30) of the liquid plasma raw material 5 and changes, rather than that erosion occurs because the direction in which the plasma raw material 5 flows through the collection pipe 12 changes due to the bent portion of the collection pipe 12. The inventor derives the following new matter from the finding from this experiment and the finding that TiN material has low impact resistance. In other words, the reason for which the TiN coating is destroyed, pipes and other components are damaged, and a part of the inner wall of the reservoir 10 is damaged is explained in the following: the pressure fluctuation (impact) generated by the collision of the plasma raw material 5 flowing through the collection pipe 12, which is collected from the container 6, with the liquid surface 18 (30) of the plasma raw material 5 stored in the reservoir 10, causes a mechanical load on the inner wall of the circulation path in the vicinity of the location of the collision. As a result, this mechanical load destroys the TiN coating provided on the inner wall of the circulation path, corrodes or deforms the inner wall surface in the region, and causes erosion, in some cases, such as pitting. For example, if a hole is developed in the inner wall of the circulation path, the plasma raw material 5 will flow into that area, then making the external insulation structure be thermally connected. This causes the temperature of the plasma raw material 5 to drop below the melting temperature. As a result, the plasma raw material 5 solidifies, leading to problems such as the stopping of the circulation of the plasma raw material 5.

In order to confirm the newly derived matter, the inventor analyzed by simulation the distribution of the magnitude of the pressure fluctuation (impact) caused by the collision between the liquid surface 18 (30) of the plasma raw material 5 stored in the reservoir 10 and the plasma raw material 5 flowing through the collection pipe 12 in each of the configurations shown in FIGS. 2A, 3A, and 3B.

Figure 4A:
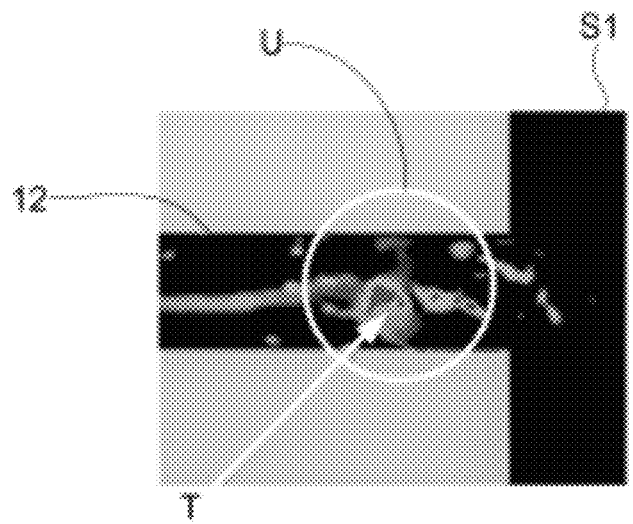
FIGS. 4A, 4B, and 4C are schematic diagrams illustrating the results of a simulation analysis of the distribution of the magnitude of pressure fluctuations (impact) caused by the collision of plasma raw material.
Figure 4B:
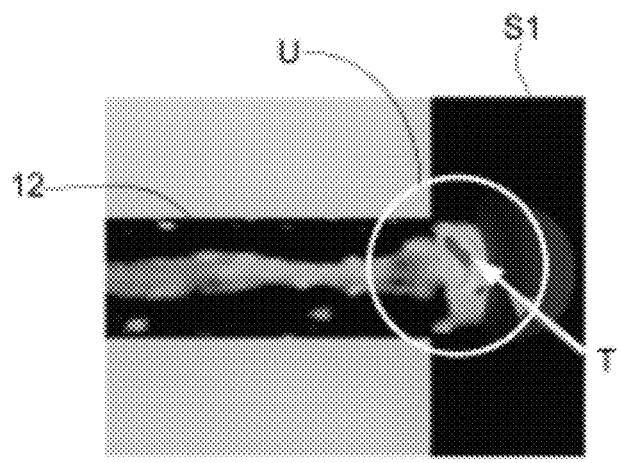
Figure 4C:
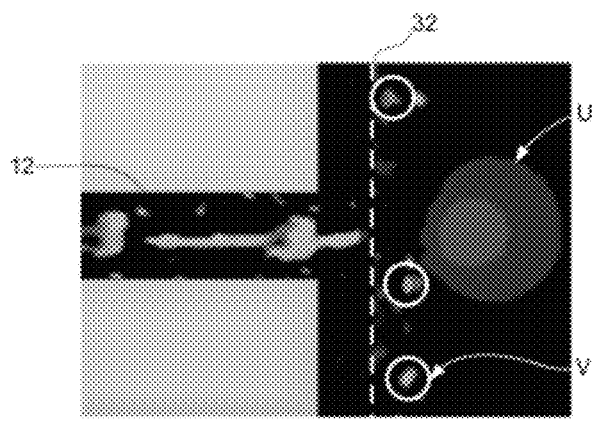

FIG. 4A is a schematic diagram illustrating the result of a simulation analysis corresponding to the configuration of FIG. 2A. FIG. 4B is a schematic diagram illustrating the result of a simulation analysis corresponding to the configuration of FIG. 3B. FIG. 4C is a schematic diagram illustrating the result of a simulation analysis corresponding to the configuration of FIG. 3A. FIGS. 4A to 4C indicates the distribution of pressure fluctuation of the connecting portion between the collection pipe 12 and the reservoir 10, when viewed from the lower side.

As shown in FIG. 4A, the portion T where the pressure fluctuation (impact) is large exists in the portion U where the flow of the collected plasma raw material 5 flowing through the collection pipe 12 collides with the liquid surface 18 (30) of the plasma raw material 5 stored in the reservoir 10. The distribution of the portion T where the pressure fluctuation (impact) is large substantially matches the location of the region R where erosion was observed as shown in FIG. 2A.

As shown in FIG. 4B, the portion T where the pressure fluctuation (impact) is large exists in the portion U where the flow of the collected plasma raw material 5 flowing through the collection pipe 12 collides with the liquid surface 18 (30) of the plasma raw material 5 stored in the reservoir 10. The result shown in FIG. 4B indicates that pressure fluctuation intensively occurs in the portion of the liquid surface 18 (30) of the plasma raw material 5 when the plasma raw material 5 enters the inside of the collection pipe 12, even if the collection pipe 12 has no bent portion. Hence, when the location in which erosion occurs is investigated in the configuration shown in FIG. 3B, erosion is considered to occur in the vicinity of the location of the liquid surface 30 inside the collection pipe 12, as similar to the configuration shown in FIG. 2A.

As shown in FIG. 4C, the configuration shown in FIG. 3A has several dispersed portions V where the pressure fluctuation (impact) is relatively large in the vicinity of the region in an inner wall 32 of the reservoir 10, in which the flow of the collected plasma raw material 5 flowing through the collection pipe 12 collides with the liquid surface 18 of the plasma raw material 5 stored in the reservoir 10. In contrast, although pressure fluctuation was observed in the collection pipe 12, no region having large pressure fluctuation (impact), which was observed in FIGS. 4A and 4B, was observed. This result corresponds well with the fact that no portion of erosion was observed in the collection pipe 12 and on the inner wall of the reservoir 10 in FIG. 3A.

Through the above discussion and examination, the inventor has newly found that in the plasma raw material supply mechanism 1, the damage to a predetermined portion of the pipe (collection pipe 12) and the vessel wall (inner wall) in the raw material supply space of the reservoir 10 is caused by the impact associated with pressure fluctuation generated by the collision between the liquid surface 18 (30) of the plasma raw material 5 stored in the reservoir 10 and the flow of the collected plasma raw material 5 flowing through the collection pipe 12. For example, during the operation of the EUV light source apparatus 2, the above collision occurs continuously for a long period of time, and thus the above-mentioned locations are continuously subjected to the impact for a long period of time. Although covalent inorganic solid materials (e.g., TiN) that are applied to the surfaces of pipes and the walls of containers serve in terms of corrosion resistance to the plasma raw material 5, with which they are in contact, their long-term resistance to such continuous impact is considered insufficient.

[Protective Member]

Figure 5A:
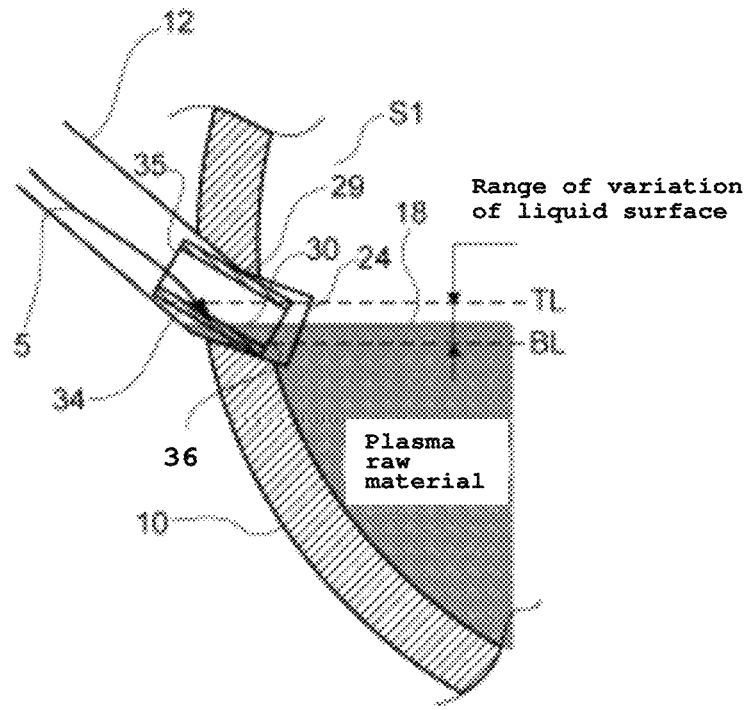
FIGS. 5A and 5B are schematic views each illustrating a configuration example using a protective member.
Figure 5B:
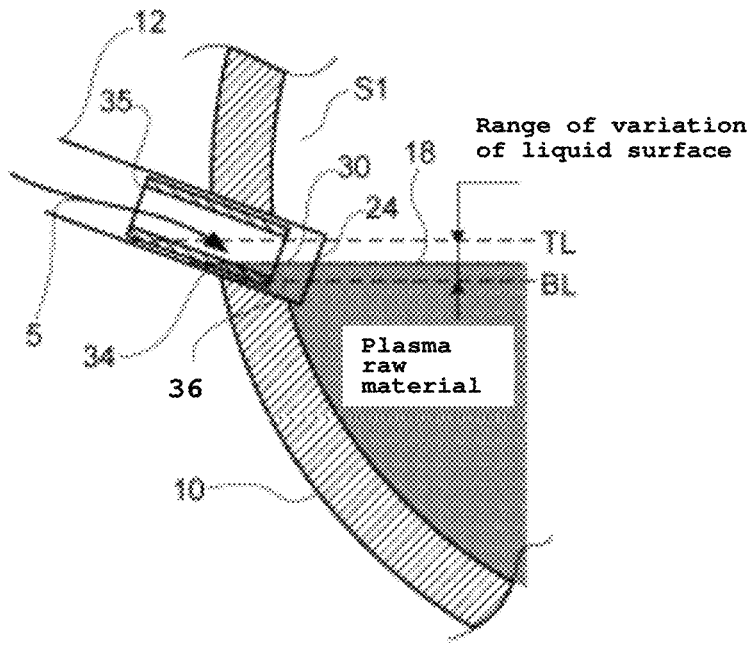

Based on the newly derived matter, the inventor has newly devised a configuration using a protective member as an effective configuration for preventing the occurrence of erosion. FIGS. 5A and 5B are each a schematic view illustrating a configuration example using a protective member. FIG. 5A corresponds to the configuration shown in FIG. 2A. FIG. 5B corresponds to the configuration shown in FIG. 3B.

As shown in FIGS. 5A and 5B, a protective member 34 is disposed to cover the portion of the inner wall of the collection pipe 12, the portion corresponding to the position where the plasma raw material 5 flowing through the collection pipe 12 collides with the plasma raw material 5 accommodated in the reservoir 10. The protective member 34 is disposed on a protective coating that is configured on the inner wall of the collection pipe 12. The location where the plasma raw material 5 collides is the location at which the liquid surface 30 of the liquid metal enters the collection pipe 12. As mentioned above, the liquid surface 30 of the plasma raw material 5 entering the inside of the collection pipe 12 typically has a position equal to that of the liquid surface 18 of the plasma raw material 5 that does not enter the inside of the collection pipe 12. The present invention may also be applicable even to the case in which the liquid surface 30 of the plasma raw material 5 entering the inside of the collection pipe 12 has a position different from that of the liquid surface 18 of the plasma raw material 5 that does not enter the inside of the collection pipe 12.

The portion of the inner wall of the collection pipe 12 corresponding to the position with which the plasma raw material 5 collides is the position with which the liquid surface 30 of the plasma raw material 5 entering the inside of the collection pipe 12 is in contact. The protective member 34 is disposed to cover this portion. For example, the region that is judged to be subject to impact due to the pressure fluctuation generated by the collision of the plasma raw material 5, with respect to the portion that is in contact with the liquid surface 30 of the plasma raw material 5 entering the inside of the collection pipe 12, is set as a protective target region. The protective member 34 is arranged to cover the protective target region. Alternatively, the protective member 34 having a predetermined size may be disposed to cover at least the portion that is in contact with the liquid surface 30 of the plasma raw material 5 entering the inside of the collection pipe 12, without specifically setting the protective target region.

In the examples shown in FIGS. 5A and 5B, a member having a hollow cylindrical shape is used as the protective member 34. In other word, the protective member 34 has a hollow structure and is configured to be a hollow cylindrical shape. The protective member 34 is inserted into the collection pipe 12 so that the protective member 34 is entirely accommodated inside the collection pipe 12. The protective member 34 has an inlet 35 through which the plasma raw material 5 flows in and an outlet 36 through which the plasma raw material 5 entering the protective member 34 drains away. The protective member 34 is disposed such that the inlet 35 is located higher than the liquid surface 30 of the plasma raw material 5 and the outlet 36 is partially located lower than the liquid surface 30 thereof. Hence, the protective member 34 is disposed to surround the liquid surface 30 of the plasma raw material 5 inside the collection pipe 12, the liquid surface 30 being collided with the plasma raw material 5 collected from the container 6. The liquid surface 30 of the plasma raw material 5 inside the collection pipe 12 may also be referred to as a fluid collision surface. The collision of the plasma raw material 5 at the fluid collision surface (liquid surface 30) occurs in the cavity of the protective member 34; thus the impact at the time of the collision is not transmitted to the outside of the protective member 34 (inner wall of the collection pipe 12). This makes it possible to prevent the impact associated with the pressure fluctuation caused by the collision of the plasma raw material 5 from being transmitted to the protective coating configured on the inner wall of the collection pipe 12.

The protective member 34 is made of a material that has long-term resistance to continuous impact. For example, the protective member 34 is made of molybdenum (Mo) or a molybdenum alloy. Examples of the molybdenum alloys include TZM (Ti—Zr—Mo:titanium-zirconium-molybdenum) alloys. However, the protective member 34 may be made of other materials, such as titanium (Ti), vanadium (V), chromium (Cr), zirconium (Zr), niobium (Nb), hafnium (Hf), tantalum (Ta), tungsten (W), rhenium (Re), ruthenium (Ru), osmium (Os), iridium (Ir), or an alloy containing at least one of these materials.

The protective member 34 may be a deformable sheet member so that it is inserted into the collection pipe 12 in a deformed state along the inner wall of the collection pipe 12. When the sheet member is rounded such that its edges touch or overlap each other, the sheet member becomes a hollow member having a cylindrical shape. For example, a molybdenum (Mo) sheet having approximately 100 μm thickness can be rounded and inserted to form a protective member 34. For example, when the protective member 34 is placed inside the bent portion 29 as shown in FIG. 5A, the protective member 34 can be easily disposed at the location of the bent portion 29 by rounding and inserting the sheet member.

In other words, the use of the sheet member enables the protective member 34 to be easily disposed, in the manner of a stent, at a desired position even in the collection pipe 12 that is not configured to be a straight line. The protective member 34 is not limited to the configuration described above, and may be a hollow tubular member that is inserted into the collection pipe 12.

The protective member 34 may be a component other than a component having a cylindrical shape to be along the entire circumference of the inner wall of the collection pipe 12. For example, there may be a case in which no portion of the inner wall of the collection pipe 12 is in contact with the liquid surface 30 of the plasma raw material 5 along the entire circumference of 360°. In such a case or the like, the protective member 34 may have, for example, a concave shape instead of a cylindrical shape to cover the region of a predetermined angular range. The protective member 34 being a sheet member that has been rounded and inserted into the collection pipe 12 may take, for example, a concave shape, which is not necessarily a cylindrical shape, as a result of an attempt to restore its original shape in the collection pipe 12. Even in such a case, the protective member 34 sufficiently achieves its function by covering the portion of the inner wall of the collection pipe 12 that is in contact with the liquid surface 30 of the plasma raw material 5.

The protective member 34 may have any configuration including size (length). The protective member 34 is typically configured to have a size capable of covering the region (protective target region) that is judged to be subject to impact associated with the pressure fluctuation generated by the collision of the plasma raw material 5. The size of the protective member 34 may be set, for example, after the protective target region is set based on the positions in which the fluid collision surface (liquid surface 30) is possibly located. The plasma raw material 5 in the reservoir 10 may have a variable liquid surface level during the circulation operation in which the plasma raw material 5 is returned to the container 6 of the plasma source 3 or is collected from the container 6. The protective target region is set in response to the variations of the liquid surface level, then the protective member 34 having a size large enough to cover the protective target region is disposed. This enables the protective member 34 to be configured to prevent the impact from being transmitted to the outside of the protective member 34 (the inner wall of the collection pipe) in response to variations of the liquid surface level.

For example, the liquid surface level of the plasma raw material 5 accommodated in the reservoir 10 may be maintained at a substantially constant level based on the detection result of the level sensor. In this case, the protective member 34 is configured to have a size capable of covering the protective target region, for example, the protective target region being set for the region to be offset vertically based on the maintained liquid surface level. Alternatively, as shown in FIGS. 5A and 5B, the plasma raw material 5 may be accommodated in the reservoir 10 to allow a predetermined range of variation. In this case, the protective target region is set based on the location of an uppermost level TL, where the liquid surface level is located at the uppermost side, and the location of a lowermost level BL, where the liquid level is located at the lowermost side. The protective member 34 is configured to have a size capable of covering the protective target region, for example, the protective target region being set for the region extending from the location offset upward with respect to the location of the uppermost level TL to the location offset downward with respect to the location of the lowermost level BL.

The protective member 34 having a larger size (length) is capable of protecting a larger area inside the collection pipe 12. In contrast, the protective member 34 having a minimum necessary size (length) contributes to reduction in the cost of its component. For example, the protective member 34 having a diameter of 30 mm by a length of 50 mm is used. However, it is not limited to this size.

In the configuration in which no protective member 34 is employed, damage inside the collection pipe 12 (destruction of the TiN coating inside the pipe and subsequent damage to the pipe) sometimes occurred when the EUV light source apparatus 2 is operated to emit several giga (billion) shots of EUV pulse radiation. In contrast, in the configuration in which the protective member 34 is disposed, no damage inside the collection pipe 12 occurred even when the operation was performed four times as many times as several giga (billion) shots of EUV pulse radiation. Therefore, the use of the protective member 34 prevents erosion caused by the plasma raw material 5.

Figure 6A:
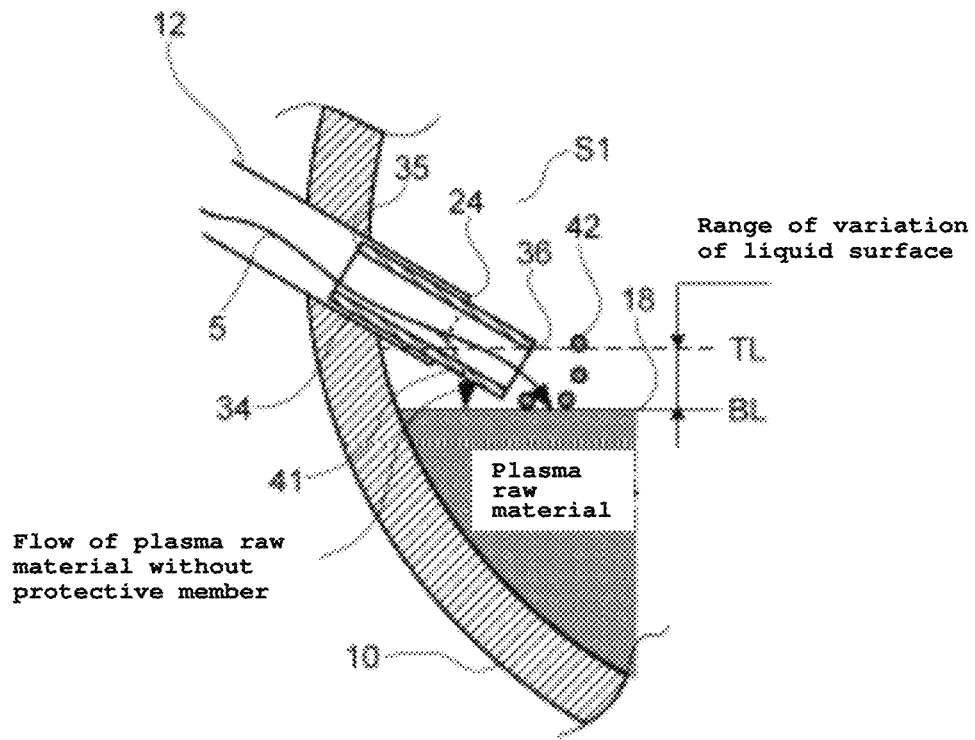
FIGS. 6A and 6B are schematic views each illustrating another configuration example using the protective member.
Figure 6B:
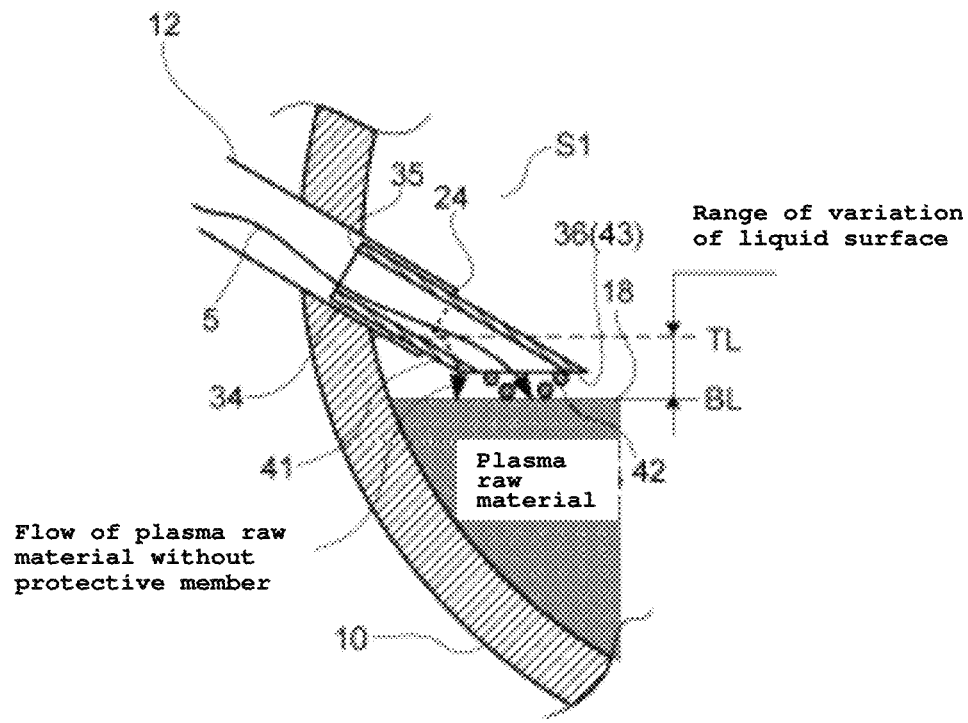

FIGS. 6A and 6B are each a schematic view illustrating a configuration of another example using the protective member 34. In the example shown in FIG. 6A, when the liquid surface level of the plasma raw material 5 reaches the lowermost level BL, the pipe outlet 24 of the collection pipe 12 is in a state of being in no contact with the plasma raw material 5 accommodated in the reservoir 10. In such a state, if the position where the plasma raw material 5 draining away from the collection pipe 12 collides with the liquid surface 18 is close to the inner wall of the reservoir 10, as shown in FIG. 2B, erosion is likely to occur in the inner wall of the reservoir 10. In contrast, as shown in FIG. 3A, when the position where the plasma raw material 5 draining away from the collection pipe 12 collides with the liquid surface 18 is far from the inner wall of the reservoir 10, no erosion occurs in the inner wall of the reservoir 10. Therefore, moving the outflow position of the plasma raw material 5 draining away from the collection pipe 12 away from the inner wall of the reservoir 10 makes it possible to prevent the erosion of the inner wall of the reservoir 10.

In the example shown in FIG. 6A, the protective member 34 inserted into the collection pipe 12 is disposed to protrude from the pipe outlet 24 of the collection pipe 12 toward the interior of the reservoir 10. The portion of the protective member 34 protruding from the pipe outlet 24 is also referred to as a protrusion 41. The end of the protrusion 41 becomes the outlet 36 through which the plasma raw material 5 that has been drained away from the pipe outlet 24 drains away toward the plasma raw material 5 accommodated in the reservoir 10.

This configuration enables the outflow position of the plasma raw material 5 to be moved away from the inner wall of the reservoir 10 by the length of the protrusion 41 of the protective member 34. As a result, this configuration enables the position where the plasma raw material 5 draining away from the collection pipe 12 collides with the liquid surface 18 to be moved away from the inner wall of the reservoir 10, thereby preventing the erosion of the inner wall of the reservoir 10.

The protective member 34 shown in FIG. 6A is capable of surrounding the fluid collision surface when the liquid surface level of the plasma raw material 5 moves upward, preventing the erosion of the inner wall of the collection pipe 12. Alternatively, when the liquid surface level of the plasma raw material 5 moves downward, the protective member 34 serves to move the outflow position of the plasma raw material 5 away from the inner wall of the reservoir 10. The protective member 34 shown in FIG. 6A may be regarded as a member for moving the outflow position or for extending the collection pipe. The protective member 34 may be designed to have a suitable size (length) capable of preventing the erosion of the inner wall of the collection pipe 12 and moving the outflow position of the plasma raw material 5 sufficiently away from the inner wall of the reservoir 10.

As shown in FIG. 6A, when the plasma raw material 5 draining away from the outlet 36 of the protective member 34 collides with the liquid surface 18, there may generate droplets 42 of the plasma raw material 5. As described above, the raw material supply space S1 of the reservoir 10 is provided with the plasma raw material replenishment port for replenishing the plasma raw material 5. If the droplets 42 generated during the collision of the plasma raw material 5 with the liquid surface 18 adhere to and accumulate on the filling port of the plasma raw material replenishment port, and thus this makes it difficult to replenish the plasma raw material 5 into the raw material supply space S1.

To suppress such a defect, the end of the protective member 34 may be preferably configured to be parallel to the liquid surface 18 of the plasma raw material 5 in the reservoir 10, as shown in FIG. 6B. In other words, the protrusion 41, which extends along a direction inclined to the liquid surface 18 of the plasma raw material 5 accommodated in the reservoir 10, may have an end face 43 constituting the outlet 36 so as to be configured to be parallel to the liquid surface 18. This configuration allows the end face 43 of the protective member 34 to cover a larger area of the fluid collision surface (liquid surface 18) from above. This allows part of the droplets 42 to enter the interior of the protective member 34, reducing the amount of droplets 42 reaching the filling port of the plasma raw material replenishment port. As a result, this configuration suppresses the defect of difficulty in supplying the plasma raw material 5 to the raw material supply space S1 of the reservoir 10 through the plasma raw material replenishment port. It is noted that any other configurations may be employed that suppress the droplets 42 of the plasma raw material 5 from reaching the filling port of the plasma raw material replenishment port. For example, the end face 43 of the protective member 34 may be configured to be at a slightly oblique angle to the liquid surface 18. Alternatively, configuring the end face 43 of the protective member 34 to be parallel to the liquid surface 18 allows the protective member 34 to be easily machined or designed, reducing the manufacturing cost of the protective member 34.

In the plasma raw material supply mechanism 1 and the EUV light source apparatus 2 according to the present embodiment, the protective member 34 is disposed on the inner wall of the collection pipe 12. The protective member 34 is disposed to cover the portion corresponding to the position where the plasma raw material 5 flowing through the collection pipe 12 collides with the plasma raw material 5 accommodated in the reservoir 10. This configuration prevents the collection pipe 12 from being eroded by the plasma raw material 5.

Applying the present invention makes it possible to improve the impact resistance of the inner wall of the collection pipe 12 without the design change of the collection pipe 12. This results in protecting the TiN coating formed on the inner wall of the collection pipe 12, thus preventing the corrosion of the collection pipe 12. Therefore, it is possible to extend the service life of the collection pipe 12, achieving a longer service life of the cooling system. This also leads to achieving a longer service life of the plasma raw material supply mechanism 1 and the EUV light source apparatus 2.

[EUV Light Source Apparatus]

Figure 7:
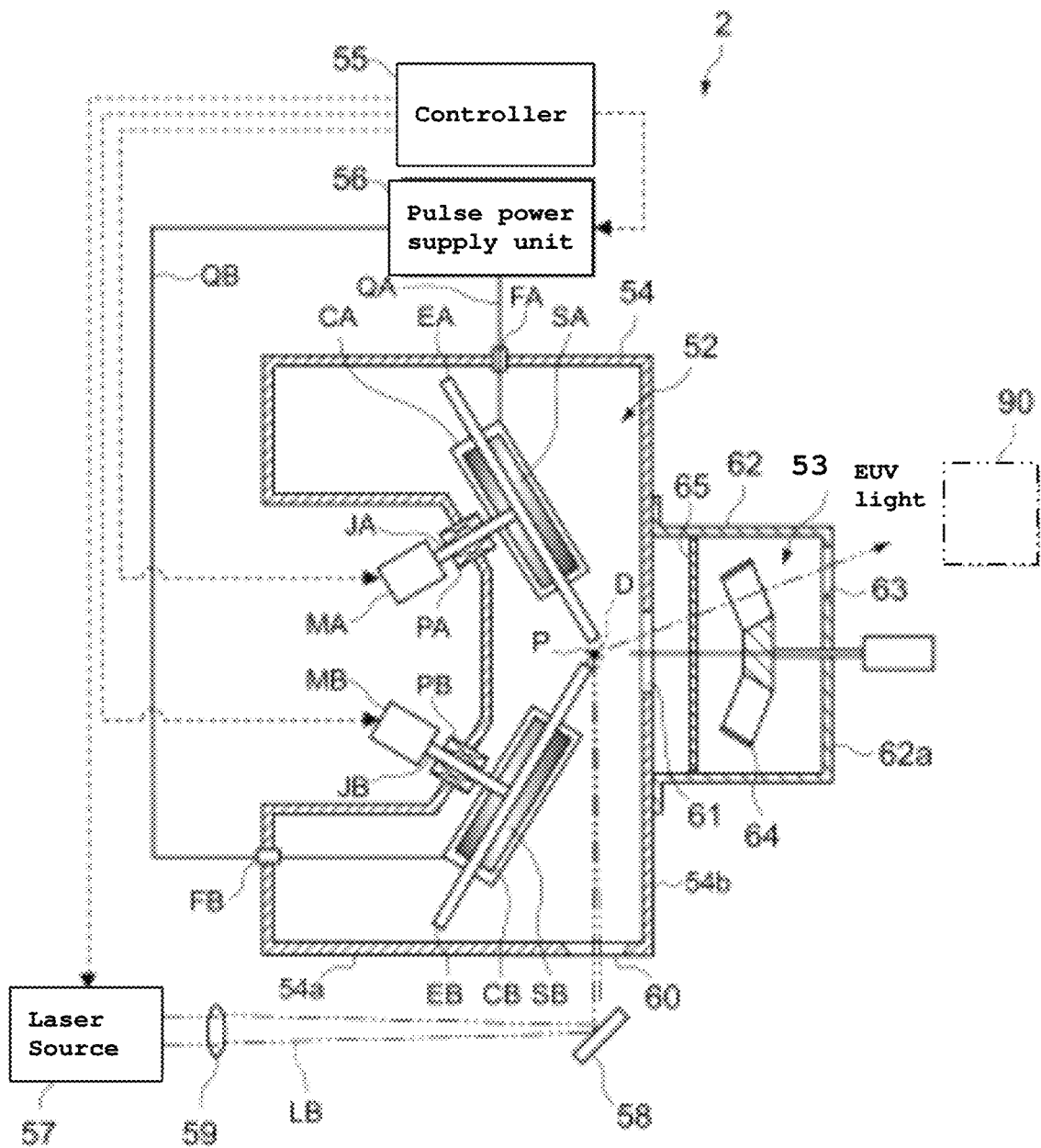
FIG. 7 is a schematic view illustrating a basic configuration example of an extreme ultraviolet light source apparatus (EUV light source apparatus).

An example of the basic configuration and operation of the EUV light source apparatus will be described below. FIG. 7 is a cross-sectional view of an extreme ultraviolet light source apparatus (EUV light source apparatus), illustrating the inside of the chamber and the connection chamber that are cut in the horizontal direction. Here, an LDP-based EUV light source apparatus is used to describe as the example. In the following description, some components that have already been described above are denoted by new symbols in order to easily understand the EUV light source apparatus.

The EUV light source apparatus 2 emits extreme ultraviolet (EUV) light. The extreme ultraviolet light has a wavelength of 13.5 nm, for example. EUV light corresponds to one embodiment of the radiation according to the present invention. The EUV light source apparatus 2 irradiates liquid-phase plasma raw materials SA and SB, which have been supplied onto the surfaces of a pair of discharge electrodes EA and EB between which discharge is to be generated, respectively, with an energy beam such as a laser beam LB to vaporize the plasma raw materials SA and SB. Then, the discharge in a discharge region D located between the discharge electrodes EA and EB generates plasma P. The plasma P emits EUV light.

The EUV light source apparatus 2 can be used, for example, as a light source apparatus for a lithography system in semiconductor device manufacturing, or a light source apparatus for a mask inspection system used in lithography. For example, when the EUV light source apparatus 2 is used as a light source apparatus for a mask inspection system, a part of the EUV light emitted from the plasma P is extracted and guided to the mask inspection system. The mask inspection system uses the EUV light emitted from the EUV light source apparatus 2 as inspection light to perform a mask blanks inspection or a mask pattern inspection. The EUV light can be used to support a process of 5 nm to 7 nm. The EUV light extracted from the EUV light source apparatus 2 is specified by an aperture (not shown) provided in a heat shield plate 65 shown in FIG. 7.

As shown in FIG. 7, the EUV light source apparatus 2 includes a light source section 52 and a debris capture section 53. The light source section 52 generates EUV light by the LDP method. The debris capture section 53 is a debris mitigation device that captures the debris scattered along with the EUV light emitted from the light source section 52. Debris, such as debris generated in the light source section 52 and debris captured in the debris capture section 53, is contained in the debris container (not shown) located on the lower side of the debris capture section 53.

The light source section 52 is provided with a chamber 54 that isolates the plasma P generated inside the chamber 54 from the outside. The chamber 54 forms a plasma generation chamber that accommodates the light source section 52 where the plasma P is generated. The chamber 54 is a vacuum enclosure made of a rigid body, e.g., metal, and its interior is maintained in a reduced-pressure atmosphere below a predetermined pressure by a vacuum pump, which is not shown in the figure, in order to successfully generate discharge for heating and exciting the plasma raw materials SA and SB and to suppress EUV light from being attenuated.

The light source section 52 is provided with a pair of the discharge electrodes EA and EB. The discharge electrodes EA and EB are each a disc-shaped member and have the same shape and size. For example, the discharge electrode EA is used as a cathode and the discharge electrode EB is used as an anode. The discharge electrodes EA and EB are formed from a high-melting-point metal such as molybdenum (Mo), tungsten (W), or tantalum (Ta). The discharge electrodes EA and EB are disposed apart from each other, and the circumferential edge portions of the discharge electrodes EA and EB are in close proximity to each other. The discharge region D, in which the plasma P is generated, is located in a gap between the discharge electrodes EA and EB, in which the circumferential edge portions of the discharge electrodes EA and EB come closest to each other.

The chamber 54 includes a container CA in which the liquid-phase plasma raw material SA is stored and a container CB in which the liquid-phase plasma raw material SB is stored. The containers CA and CB are supplied with the heated, liquid-phase plasma raw materials SA and SB, respectively. The liquid-phase plasma raw materials SA and SB are, for example, made of tin (Sn); however, they may also be made of lithium (Li).

The container CA accommodates the plasma raw material SA such that the lower part of the discharge electrode EA is immersed in the liquid-phase plasma raw material SA. The container CB accommodates the plasma raw material SB such that the lower part of the discharge electrode EB is immersed in the liquid-phase plasma raw material SB. Hence, the liquid-phase plasma raw materials SA and SB adhere to the lower parts of the discharge electrodes EA and EB. The liquid-phase plasma raw materials SA and SB, which have adhered to the lower parts of the discharge electrodes EA and EB, respectively, are transported to the discharge region D in which the plasma P is generated along with the rotation of the discharge electrodes EA and EB.

The discharge electrode EA is coupled to a rotation shaft JA of a motor MA and rotates around an axis of the discharge electrode EA. The discharge electrode EB is coupled to a rotation shaft JB of a motor MB and rotates around an axis of the discharge electrode EB. The motors MA and MB are disposed outside the chamber 54, and have their rotation shafts JA and JB extending from the outside to the inside of the chamber 54, respectively. The gap between the rotation shaft JA and a wall of the chamber 54 is sealed with a seal member PA, and the gap between the rotation shaft JB and the wall of the chamber 54 is sealed with a seal member PB. The seal members PA and PB are, for example, mechanical seals. The seal members PA and PB rotatably support the rotation shafts JA and JB respectively while maintaining the reduced-pressure atmosphere in the chamber 54.

As shown in FIG. 7, the EUV light source apparatus 2 further includes a controller 55, a pulse power supply unit 56, a laser source (energy beam irradiation device) 57, and a movable mirror 58. The controller 55, the pulse power supply unit 56, the laser source 57, and the movable mirror 58 are mounted outside the chamber 54. The controller 55 controls the operation of each section of the EUV light source apparatus 2. For example, the controller 55 controls the rotation drive of the motors MA and MB to rotate the discharge electrodes EA and EB at a predetermined rotation speed. The controller 55 also controls the operation of the pulse power supply unit 56, the irradiation timing of the laser beam LB from the laser source 57, and the like.

The containers CA and CB, which are disposed inside the chamber 54, are connected with two power feed lines QA and QB extending from the pulse power supply unit 56 and passing through feedthroughs FA and FB, respectively. The feedthroughs FA and FB are seal members that are embedded in the walls of the chamber 54 to maintain a reduced-pressure atmosphere in the chamber 54. The containers CA and CB are formed from conductive materials, and the plasma raw materials SA and SB accommodated inside the containers CA and CB are also conductive materials such as tin. The lower parts of the discharge electrodes EA and EB are immersed in the plasma raw materials SA and SB accommodated inside the containers CA and CB, respectively. Hence, when the pulse power supply unit 56 supplies pulse power to the containers CA and CB, the pulse power is supplied to the discharge electrodes EA and EB through the plasma raw materials SA and SB, respectively, The pulse power supply unit 56 supplies the pulse power to the discharge electrodes EA and EB to generate discharge in the discharge region D. The plasma raw materials SA and SB that have been transported to the discharge region D by the rotation of the respective discharge electrodes EA and EB are heated and excited by the current flowing between the discharge electrodes EA and EB during the discharge, thereby generating the plasma P that emits EUV light.

The laser source 57 irradiates the plasma raw material SA that has adhered to the discharge electrode EA and has been transported to the discharge region D with the energy beam to vaporize the plasma raw material SA. The laser source 57 is, for example, a Nd:YVO$_4$ (Neodymium-doped Yttrium Orthovanadate) laser device. Then, the laser source 57 emits the laser beam LB in the infrared region having a wavelength of 1064 nm. However, the energy beam irradiation device may be a device that emits an energy beam other than the laser beam LB, provided that it is capable of vaporizing the plasma raw material SA.

The laser beam LB emitted from the laser source 57 is guided to the movable mirror 58 via a condensing means including, for example, a condensing lens 59. The condensing means adjusts a spot diameter of the laser beam LB at a laser beam irradiation position of the discharge electrode EA. The condensing lens 59 and the movable mirror 58 are disposed outside the chamber 54.

The laser beam LB focused by the condensing lens 59 is reflected by the movable mirror 58, passes through a transparent window 60 provided in a side wall 54*a* of the chamber 54. The circumferential edge portion of the discharge electrode EA near the discharge region D is irradiated with the laser beam LB. The irradiation position of the laser beam LB onto the discharge electrode EA is adjusted by adjusting the posture of the movable mirror 58.

In order to facilitate the irradiation of the laser beam LB onto the circumferential edge portion of the discharge electrode EA near the discharge region D, the axes of the discharge electrodes EA and EB are not aligned in parallel. The spacing between the rotation shafts JA and JB is narrower on the side of the motors MA and MB and wider on the side of the discharge electrodes EA and EB. This configuration allows the discharge electrodes EA and EB to be located closer to each other at the side of their facing surfaces while the opposite side of their facing surfaces of the discharge electrodes EA and EB is retreated from the irradiation path of the laser beam LB, making it easier to irradiate the circumferential edge portion of the discharge electrode EA near the discharge region D with the laser beam LB.

The discharge electrode EB is disposed between the discharge electrode EA and the movable mirror 58. The laser beam LB reflected by the movable mirror 58 passes near the outer circumferential surface of the discharge electrode EB and then reaches the outer circumferential surface of the discharge electrode EA. At this time, to prevent the laser beam LB from being blocked by the discharge electrode EB, the discharge electrode EB is retreated to the direction of the motor MB side (left side in FIG. 7) from the discharge electrode EA. The liquid-phase plasma raw material SA that has adhered to the outer circumferential surface of the discharge electrode EA near the discharge region D is vaporized by the laser beam LB irradiation and supplied to the discharge region D as gas-phase plasma raw material SA.

The pulse power supply unit 56 supplies power to the discharge electrodes EA and EB to generate the plasma P in the discharge region D (to convert the gas-phase plasma raw material SA into plasma). When the gas-phase plasma raw material SA is supplied to the discharge region D by the laser beam LB irradiation, the discharge occurs between the discharge electrodes EA and EB in the discharge region D. The discharge occurring between the discharge electrodes EA and EB heats and excites the gas-phase plasma raw material SA in the discharge region D with its electric current, generating the plasma P. The generated plasma P emits EUV light, and the EUV light enters the debris capture section 53 through a first window 61, which is a through hole provided in a side wall 54*b* of the chamber 54.

The debris capture section 53 includes a connection chamber 62 disposed on the side wall 54*b* of the chamber 54. The connection chamber 62 is a vacuum enclosure made of a rigid body, e.g., metal, and its interior is maintained in a reduced-pressure atmosphere below a predetermined pressure to suppress the EUV light from being attenuated, similar to the chamber 54. The connection chamber 62 is connected between the chamber 54 and a utilization apparatus 90, e.g., a lithography system or a mask inspection system.

The interior space of the connection chamber 62 communicates with the chamber 54 through the first window 61. The connection chamber 62 includes a second window 63 as a light extraction section that introduces EUV light coming from the first window 61 to the utilization apparatus 90. The second window 63 is a through hole having a predetermined shape formed in a side wall 62*a* of the connection chamber 62. EUV light emitted from the plasma P in the discharge region D is introduced into the utilization apparatus 90 through the first window 61 and the second window 63.

Meanwhile, the plasma P releases debris at high speed in various directions along with EUV light. The debris includes particles of tin, which derive from the plasma raw materials SA and SB, and particles of material of the discharge electrodes EA and EB, which are sputtered with the generation of plasma P. The debris obtains a large amount of kinetic energy through the contraction and expansion process of the plasma P. In other words, the debris generated from the plasma P contains ions, neutral particles, and electrons moving at high speed. When such debris reaches the utilization apparatus 90, it may damage or contaminate reflective coatings of optical elements disposed in the utilization apparatus 90, degrading its performance.

Hence, the debris capture section 53, which captures the debris, is provided in the connection chamber 62 to prevent the debris from entering the utilization apparatus 90. In the example shown in FIG. 7, a rotary foil trap 64 that has a plurality of foils and that rotates to actively collide the plurality of foils with the debris is disposed as the debris capture section 53. The rotary foil trap 64 is disposed inside the connection chamber 62 and on the optical path of the EUV light traveling from the connection chamber 62 to the utilization apparatus 90. A fixed foil trap having a plurality of foils with a fixed position may be disposed instead of the rotary foil trap 64. Alternatively, both the rotary foil trap 64 and the fixed foil trap may be provided.

Other Embodiments

The present invention is not limited to the embodiments described above, and can provide various other embodiments.

In the above, the EUV light source apparatus is described as one embodiment of the operation apparatus that operates using liquid metal. Also described is the case in which the circulation apparatus according to the present invention is configured in the EUV light source apparatus. The application of the present invention is not limited to EUV light source apparatuses. The present invention can be applied to various cooling systems that use liquid metal as a refrigerant in various applications, such as the cooling of high-performance circuits, nuclear reactors, and radiation sources in the X-ray range. The present invention can also be applied to, for example, fast breeder reactors such as sodium-cooled fast reactors. The circulation mechanism according to the present invention can also be applied to various apparatuses that operate using liquid metal in systems that are applied to applications different from the cooling system.

The EUV light source apparatus, circulation mechanism, protective members, and other configurations described with reference to the drawings are merely one embodiment, and can be modified to the extent so as not to depart from the scope of the present technology. In other words, any other configuration may be adopted to implement the present technology.

In the present disclosure, words such as "about", "substantially", and "approximately" are suitably used to readily understand the explanation. On the other hand, there is no clear difference between the cases in which these words "about", "substantially", and "approximately" are used and the cases in which they are not used. In other words, in the present disclosure, concepts that define shape, size, position relationship, and state, such as "center", "middle", "uniform", "equal", "same", "perpendicular", "parallel", "symmetrical", "extending", "axial direction", "cylindrical shape", "cylindrical hollow shape", "ring shape", and "annular shape", are concepts including "substantially center", "substantially middle", "substantially uniform", "substantially equal", "substantially same", "substantially perpendicular", "substantially parallel", "substantially symmetrical", "substantially extending", "substantially axial direction", "substantially cylindrical shape", "substantially cylindrical hollow shape", "substantially ring shape", and "substantially annular shape". The concepts also include concepts having states in a predetermined range (e.g., ±10% range) with respect to, for example, "exactly center", "exactly middle", "exactly uniform", "exactly equal", "exactly same", "exactly perpendicular", "exactly parallel", "exactly symmetrical", "exactly extending", "exactly axial direction", "exactly cylindrical shape", "exactly cylindrical hollow shape", "exactly ring shape", and "exactly annular shape". Hence, even when the words such as "about", "substantially", and "approximately" are not added, the concepts may include those that are expressed by adding "about", "substantially", "approximately", and the like. Conversely, states expressed by adding "about", "substantially", "approximately", and the like, do not necessarily exclude their exact states.

In the present disclosure, expressions using the term "than" such as "greater than A" and "less than A" are expressions that comprehensively include concepts that include the case that is equal to A and concepts that do not include the case that is equal to A. For example, "greater than A" is not limited to the case where it does not include "equal to A"; however, it also includes "equal to or greater than A". Also, "less than A" is not limited to "less than A"; it also includes "equal to or less than A". Upon the implementation of the present technology, specific settings and other settings are suitably adopted from the concepts that are included in "greater than A" and "less than A" to achieve the effects described above.

Among the characteristic portions according to the present technology described above, it is also possible to combine at least two of the characteristic portions. In other words, the various characteristic portions described in each embodiment may be optionally combined without restricting to the embodiment. The various effects described above are merely examples and are not limitative; other effects may also be achieved.

What is claimed is:

1. A circulation mechanism comprising:
   a storage section that accommodates liquid metal; a
   supply pipe that supplies the liquid metal accommodated in the storage section to a target mechanism; a
   collection pipe that is communicated with the storage section and collects the liquid metal that has been drained away from the target mechanism into the storage section;
   a circulation drive section that allows the liquid metal accommodated in the storage section to move to the supply pipe, and thus circulates the liquid metal to and from the target mechanism; and
   a protective member that is disposed to cover a portion of an inner wall of the collection pipe, the portion corresponding to a position at which the liquid metal flowing through the collection pipe collides with the liquid metal accommodated in the storage section, wherein the protective member includes a deformable sheet member and is inserted into the interior of the collection pipe in a deformed state along the inner wall of the collection pipe.

2. The circulation mechanism according to claim 1, wherein the collection pipe is communicated with the storage section at a location at which the liquid metal accommodated in the storage section enters the interior of the collection pipe,
And the protective member is disposed to cover a portion of the inner wall of the collection pipe that is in contact with a liquid surface of the liquid metal entering the inside of the collection pipe.

3. The circulation mechanism according to claim 1, wherein the collection pipe includes a protective coating configured on the inner wall of the collection pipe, and the protective member is disposed on the protective coating.

4. The circulation mechanism according to claim 1, wherein the protective member has a hollow cylindrical shape and is inserted into the interior of the collection pipe.

5. The circulation mechanism according to claim 1, wherein the protective member includes a hollow tubular member and is inserted into the interior of the collection pipe.

6. The circulation mechanism according to claim 1, wherein the liquid metal includes tin, lithium, gadolinium, terbium, gallium, or an alloy containing at least one of these materials.

7. The circulation mechanism according to claim 1, wherein the protective member includes molybdenum, titanium, vanadium, chromium, zirconium, niobium, hafnium, tantalum, tungsten, rhenium, ruthenium, iridium, or an alloy containing at least one of these materials.

8. The circulation mechanism according to claim 3, wherein the protective coating includes titanium nitride, titanium, or an alloy containing at least one of these materials.

9. The circulation mechanism according to claim 1, wherein the storage section includes a connection hole to which the collection pipe is connected, and the collection pipe is connected to the connection hole in a manner in which the collection pipe protrudes from the connection hole toward the interior of the storage section.

10. The circulation mechanism according to claim 1, wherein the collection pipe includes a pipe outlet through which the liquid metal drains away to the storage section,
   the protective member includes a protrusion that protrudes from the pipe outlet toward the interior of the storage section, and
   the protrusion includes an outlet through which the liquid metal that has been drained away from the pipe outlet drains away to the liquid metal accommodated in the storage section.

11. The circulation mechanism according to claim 10, wherein the protrusion extends along a direction inclined to a liquid surface of the liquid metal accommodated in the storage section, and the outlet of the protrusion includes an end face that is configured to be parallel to the liquid surface.

12. The circulation mechanism according to claim 1, wherein the collection pipe includes a pipe inlet through which the liquid metal that has been drained away from the target mechanism flows in, and a pipe outlet through which the liquid metal drains away to the storage section, the pipe outlet being located lower than the pipe inlet in a vertical direction, and is disposed inclined to the storage section.

13. The circulation mechanism according to claim 1, further comprising a temperature adjustment mechanism that adjusts a temperature for at least one of the liquid metal flowing through the collection pipe, the liquid metal accommodated in the storage section, or the liquid metal flowing through the supply pipe.

* * * * *